US009335855B2

(12) United States Patent
Lai et al.

(10) Patent No.: US 9,335,855 B2
(45) Date of Patent: May 10, 2016

(54) TOP-EMITTING OLED DISPLAY HAVING TRANSPARENT TOUCH PANEL

(75) Inventors: Yuang Wei Lai, Yuanlin Township, Changhua County (TW); Hsien Chang Lin, Zhubei (TW)

(73) Assignee: RITDISPLAY CORPORATION, Hsinchu (TW)

( * ) Notice: Subject to any disclaimer, the term of this patent is extended or adjusted under 35 U.S.C. 154(b) by 97 days.

(21) Appl. No.: 13/553,110

(22) Filed: Jul. 19, 2012

(65) Prior Publication Data

US 2012/0306812 A1 Dec. 6, 2012

Related U.S. Application Data

(63) Continuation-in-part of application No. 11/783,842, filed on Apr. 12, 2007, now Pat. No. 8,253,692.

(30) Foreign Application Priority Data

Apr. 14, 2006 (TW) .................. 95113483 A

(51) Int. Cl.
*G09G 3/32* (2006.01)
*G06F 3/041* (2006.01)
(Continued)

(52) U.S. Cl.
CPC .............. *G06F 3/0412* (2013.01); *G06F 3/044* (2013.01); *H01L 27/323* (2013.01);
(Continued)

(58) Field of Classification Search
CPC ..... G06F 3/041; G06F 3/0416; G06F 3/0412; G06F 3/04883; G06F 3/016; G06F 3/0488; G06F 2203/04104; G06F 3/017
USPC ........... 345/172, 168, 104, 156, 157, 87, 179, 345/102, 76–83, 107, 173–178; 341/23; 178/18.01, 18.03, 18.06, 18.07; 313/463–572
See application file for complete search history.

(56) References Cited

U.S. PATENT DOCUMENTS 6,896,618 B2* 5/2005 Benoy et al. ............ 463/25
2001/0046604 A1* 11/2001 Geaghan ................ 428/412
(Continued)

FOREIGN PATENT DOCUMENTS

CN 1536527 10/2004
CN 1652651 10/2004
(Continued)

OTHER PUBLICATIONS

English translation of the abstract of the Corresponding TW application publication No. 200604007, published Feb 1, 2006; Corresponding CN patent publication No. 1536527, published Oct. 13, 2004; Corresponding JP patent publication No. 2006086517, published Mar. 30, 2006 ;Corresponding CN patent publication No. 1652651, published Aug. 10, 2005.
(Continued)

*Primary Examiner* — Olga Merkoulova
(74) *Attorney, Agent, or Firm* — Chun-Ming Shih

(57) ABSTRACT

A top-emitting OLED display having a transparent touch panel includes a substrate, an upper cover plate, an OLED device, a capacitive touch device, and a protective layer. The OLED device is stacked on the substrate, and the capacitive touch device is stacked on upper surface of the upper cover plate. The capacitive touch device includes a capacitor structure which is composed of a first transparent conductive layer, an isolating layer, and a second transparent conductive layer. The protective layer is disposed on top of the capacitor structure.

32 Claims, 7 Drawing Sheets

(51) Int. Cl.
*H01L 27/32* (2006.01)
*H03K 17/96* (2006.01)
*G06F 3/044* (2006.01)
*H01L 51/52* (2006.01)

(52) U.S. Cl.
CPC ........... *H03K 17/962* (2013.01); *H01L 51/524* (2013.01); *H01L 2251/5315* (2013.01); *H03K 2017/9602* (2013.01); *H03K 2217/96031* (2013.01); *H03K 2217/960755* (2013.01); *H03K 2217/960785* (2013.01)

(56) References Cited

U.S. PATENT DOCUMENTS

| | | | |
|---|---|---|---|
| 2002/0171610 A1 | 11/2002 | Siwinski et al. | |
| 2002/0186208 A1 | 12/2002 | Feldman et al. | |
| 2003/0064540 A1* | 4/2003 | Auch et al. | 438/99 |
| 2003/0222857 A1* | 12/2003 | Abileah | 345/173 |
| 2003/0234769 A1* | 12/2003 | Cross et al. | 345/173 |
| 2004/0080267 A1* | 4/2004 | Cok | 313/512 |
| 2004/0090426 A1 | 5/2004 | Bourdelais et al. | |
| 2007/0248799 A1* | 10/2007 | DeAngelis et al. | 428/209 |

FOREIGN PATENT DOCUMENTS

| | | |
|---|---|---|
| JP | 2006086517 | 3/2006 |
| TW | 200604007 | 2/2006 |
| WO | 2004114105 | 12/2004 |

OTHER PUBLICATIONS

Office Action of Corresponding application TW 095113483, filed Apr. 14, 2006, cites US20020171610 and TW 200604007.
Office Action of Corresponding application CN 2006100755810, filed Apr. 20, 2006, cites WO2004114105, CN1536527, JP2006086517, and CN 1652651.

* cited by examiner

TOP-EMITTING OLED DISPLAY HAVING TRANSPARENT TOUCH PANEL

CROSS-REFERENCE TO RELATED APPLICATIONS

This application is a continuation-in-part of U.S. application Ser. No. 11/783,842, filed Apr. 12, 2007 now U.S. Pat. No. 8,253,692.

BACKGROUND OF THE INVENTION

1. Field of the Invention

The present invention relates to a transparent touch screen, and more particularly to a top-emitting OLED (Organic Light Emitting Diode) display having a transparent touch panel.

2. Description of the Related Art

OLED display devices are divided into two light emitting modes that are the bottom-emitting mode and the top-emitting mode. The rays emitted from the organic light emitting layer of a bottom-emitting OLED may be blocked by the thin-film transistors (TFT) on the substrate, the aperture ratio is greatly reduced in TFT-OLED. Therefore, the top-emitting OLED is an alternative to improve the ratio of effective light emitting area over total area.

Touch panel is a simple, user-friendly and space-saving input apparatus used in, to name a few, tourist guiding systems, automatic teller machines (ATMs), palm computers, point-of-sale (POS) terminals and industrial control systems.

US Patent Publication No. US 2002/0186208 A1 discloses an electroluminescent (EL) display apparatus with a touch screen. The apparatus includes a transparent substrate, a resistive touch device disposed on one surface of the transparent substrate and an EL display device disposed on the other surface of the transparent substrate. However, the design which the resistive touch device and the EL device are disposed on two corresponding surfaces of the transparent substrate is likely to generate scratches during the manufacturing process. Moreover, the resistive touch device possesses low sensitivity and is not considered a preferred solution in terms of industrial usability.

US Patent Publication No. 2004/0080267 A1 discloses an integrated device of an organic light emitting display (OLED) and a touch screen. The resistive touch device is adopted in this integrated device and is formed on a cover in advance. The combination of the cover and the resistive touch device is then mounted on the organic light emitting display. Due to the low sensitivity of the resistive touch device, scratches are prone to form as a result of excessive pressure exerted on the touch device. Users tend to use assisting tools with sharp tips, such as a pen, in response to the low sensitivity nature of the resistive touch device. Moreover, the resistive touch device integrated with the cover is prone to be affected when the OLED is successively combined.

US Patent publication No. 2004/0090426 A1 discloses a packaged device of an OLED and a touch screen. The resistive touch device is equipped on the surface of the transparent substrate which serves to form the packaged OLED. However, the fabricating method disclosed in such US patent publication is rather complicated, and the lifetime of the organic luminescent material is shortened due to the harsh manufacturing environment of fabricating the resistive touch device. Again, the sensitivity is not a competitive strength of the resistive touch device.

In light of the aforementioned prior arts, a touch panel capable of precisely and sensitively sensing meaningful touches is driven by market force. The utilization of a transparent touch panel further facilitates applications such as input devices integrated with various display screens.

SUMMARY OF THE INVENTION

An objective of the present invention is to provide a top-emitting OLED display having a transparent touch panel, which possesses high light transmittance, high sensitivity and anti-scratch features.

In one embodiment of the present invention, the top-emitting OLED display having a transparent touch panel includes a substrate, an upper cover plate, an OLED device, a capacitive touch device, and a protective layer.

Another embodiment discloses the OLED device stacking on the substrate, and the capacitive touch device stacking on the upper surface of the upper cover plate. A sealant layer combines the substrate and the upper cover plate so that the OLED device is enclosed between the substrate and the upper cover plate.

In one embodiment of the present invention, the capacitive touch device comprises a first transparent conductive layer, an isolating layer, and a second transparent conductive layer disposed on the upper surface of the upper cover plate.

In one embodiment of the present invention, the capacitive touch device of the top-emitting OLED display further includes a polarizer disposed on the capacitor. The polarizer can either be placed on top or below the protective layer.

In one embodiment of the present invention, the capacitive touch device further include an electromagnetic shielding layer having a polymer insulating layer and a third transparent conductive layer. The electromagnetic shielding layer is able to effectively reduce electromagnetic interference between the OLED structure and the capacitive touch device.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

PREFERRED EMBODIMENT OF THE PRESENT INVENTION

Figure 1:
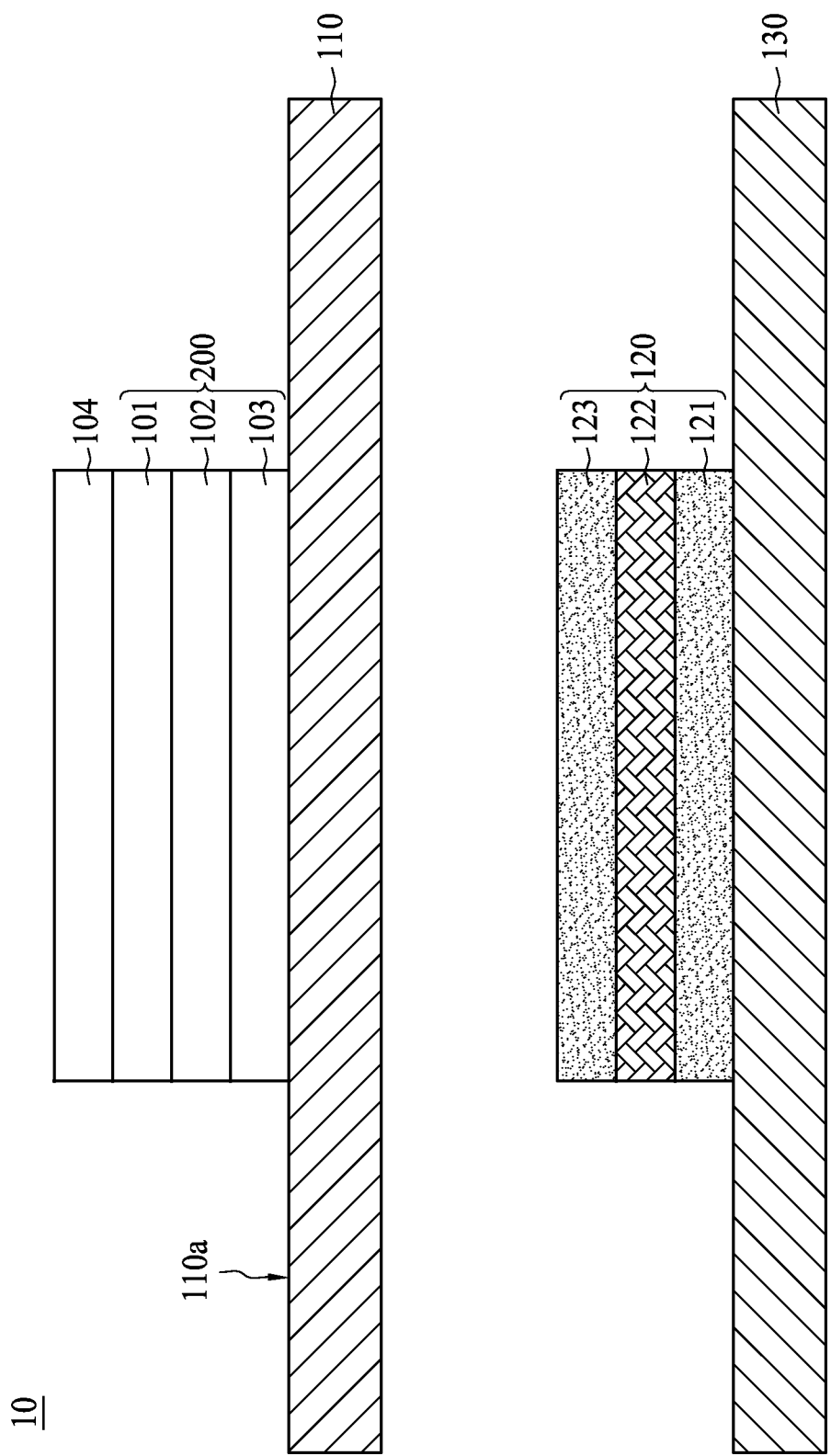
FIG. 1 is a schematic sectional view of a top-emitting OLED display having a transparent touch panel and a protective layer in accordance with one embodiment of the present invention.

FIG. 1 is a schematic sectional view of a top-emitting OLED display having a transparent touch panel 10 in accordance with the first embodiment of the present invention. The transparent touch screen 10 includes a substrate 130, an upper cover plate 110, an OLED device 120, a capacitive touch device 200 and a protective layer 104.

The OLED device 120 is disposed on the substrate 130, and the capacitive touch device 200 is stacked on a surface of the upper cover plate 110. Preferably, the capacitive touch device 200 is positioned on the upper surface 110a of the upper cover plate 110. Such structural configuration is able to raise the sensitivity of the capacitive touch device 200 compared to its counterpart in which the capacitive touch device 200 is attached to the lower surface of the upper cover plate 110. In another embodiment of the present invention, a protective layer 104 is disposed on top of the capacitive touch device 200 in order to protect the structural integrity of the capacitive touch device 200. Users are allowed to use a conductive object, for example, a finger, to make direct physical contact with the protective layer.

The protective layer 104 is configured to allow the underlying capacitive touch device 200 to sense the pressure exerted on the touch screen. In one embodiment of the present invention, the protective layer 104 can be composed of organic materials, preferably silicon oxide, silicon nitride, titanium oxide, or the combination thereof. The thickness of the protective layer 104 in such embodiment is 0.05 µm. However, any thickness ranging from 0.01 µm to 0.1 µm is considered equitable in serving as a protective layer given the above-mentioned organic material is used.

In another embodiment of the present invention, the protective layer 104 can be composed of inorganic materials, preferably polyimide, poly(methyl methacrylate), or the combination thereof. The thickness of the protective layer 104 in this embodiment is 1 µm. However, any thickness ranging below 2 µm is considered equitable in serving as a protective layer given the above-mentioned inorganic material is used.

The capacitive touch device 200 includes a first transparent conductive layer 101, an isolating layer 102, and a second transparent conductive layer 103. In one embodiment of the present invention, the first transparent conductive layer 101 and the second transparent conductive layer 103 are connected to an external power supply and a signal line, respectively, in such a way that the electric lines are enclosed between the two transparent conductive layers. The capacitance is determined by the voltage applied by the power supply. When the protective layer 104 is in physical contact with a conductive object, for example user's finger, the intensity of the electric field or the number of the electric lines changes, thus the capacitance changes accordingly. The signal of the capacitance change is transmitted back via the signal line, and the location of the change is located, the touched area identified.

In one embodiment of the present invention, the first and the second transparent conductive layers can be transparent conductive metal oxides such as indium tin oxide (ITO), indium zinc oxide (IZO), aluminum zinc oxide (AZO), or the combination thereof. The material of the isolating layer 102 is epoxy, poly-imide or poly (methyl methacrylate).

Figure 2:
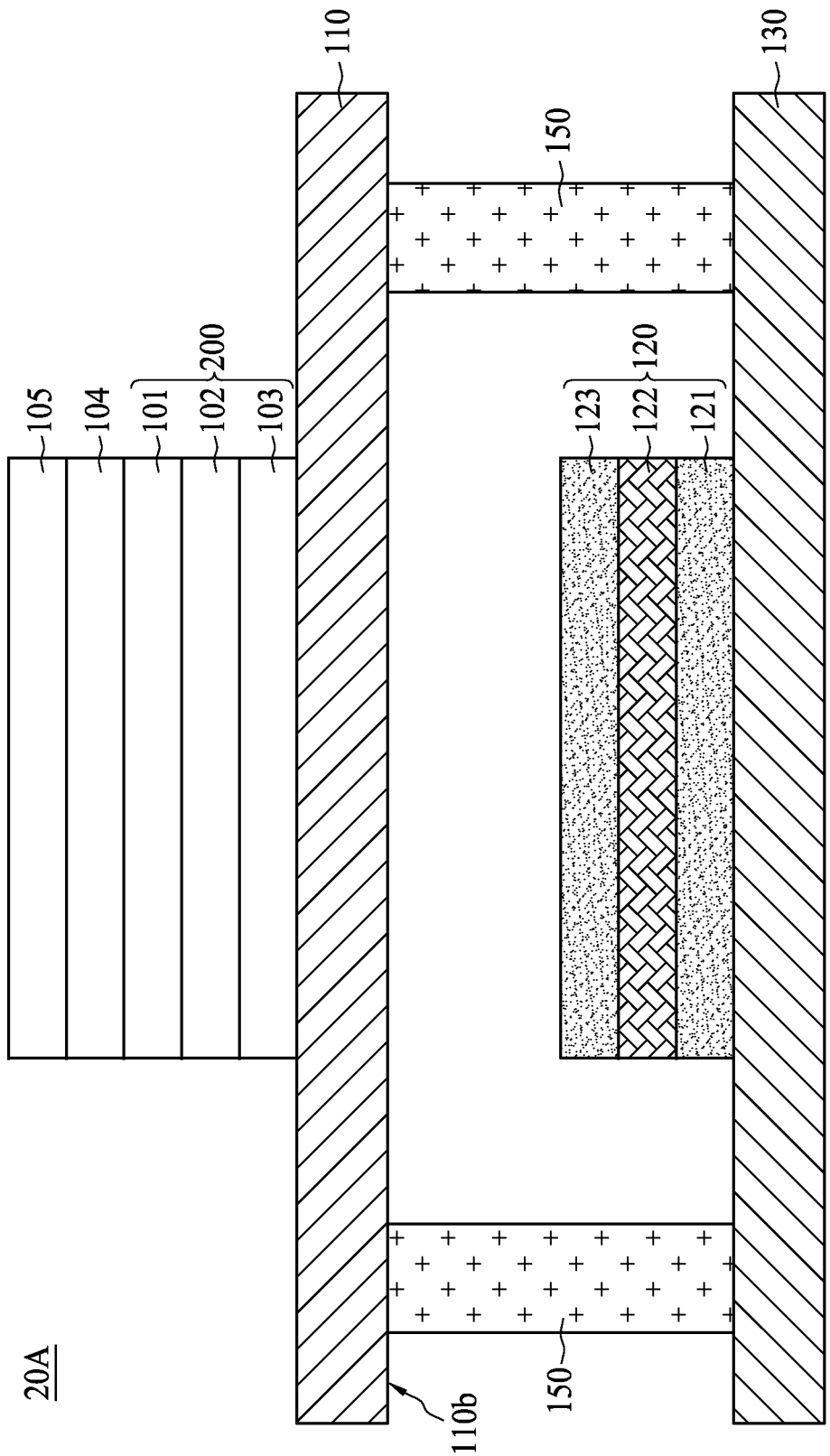
FIG. 2 is a schematic sectional view of a top-emitting OLED display having a transparent touch panel, a protective layer, and a polarizer in accordance with one embodiment of the present invention.

FIG. 2 is a schematic sectional view of a top-emitting OLED display having a transparent touch panel 20A, a protective layer 104, and a polarizer 105 in accordance with an embodiment of the present invention. A sealant layer 150 surrounds the OLED device 120 in the present embodiment. In FIG. 2, the OLED device 120 is sealed by the substrate 130, the sealant layer 150, and the upper cover plate 110. The upper cover plate 110 is attached to the substrate 130 by the sealant layer 150. Organic materials used for OLED device 120 are prone to be degraded by water vapor and various environmental factors. The sealant layer 150 serves as a protection barrier to prolong the lifetime of the OLED device 120. In another embodiment of the present invention, the capacitive touch device 200 is attached to the bottom surface 110b of the upper cover plate 110, thus the sealant layer 150 also serves to protect such capacitive touch device 200.

Figure 3:
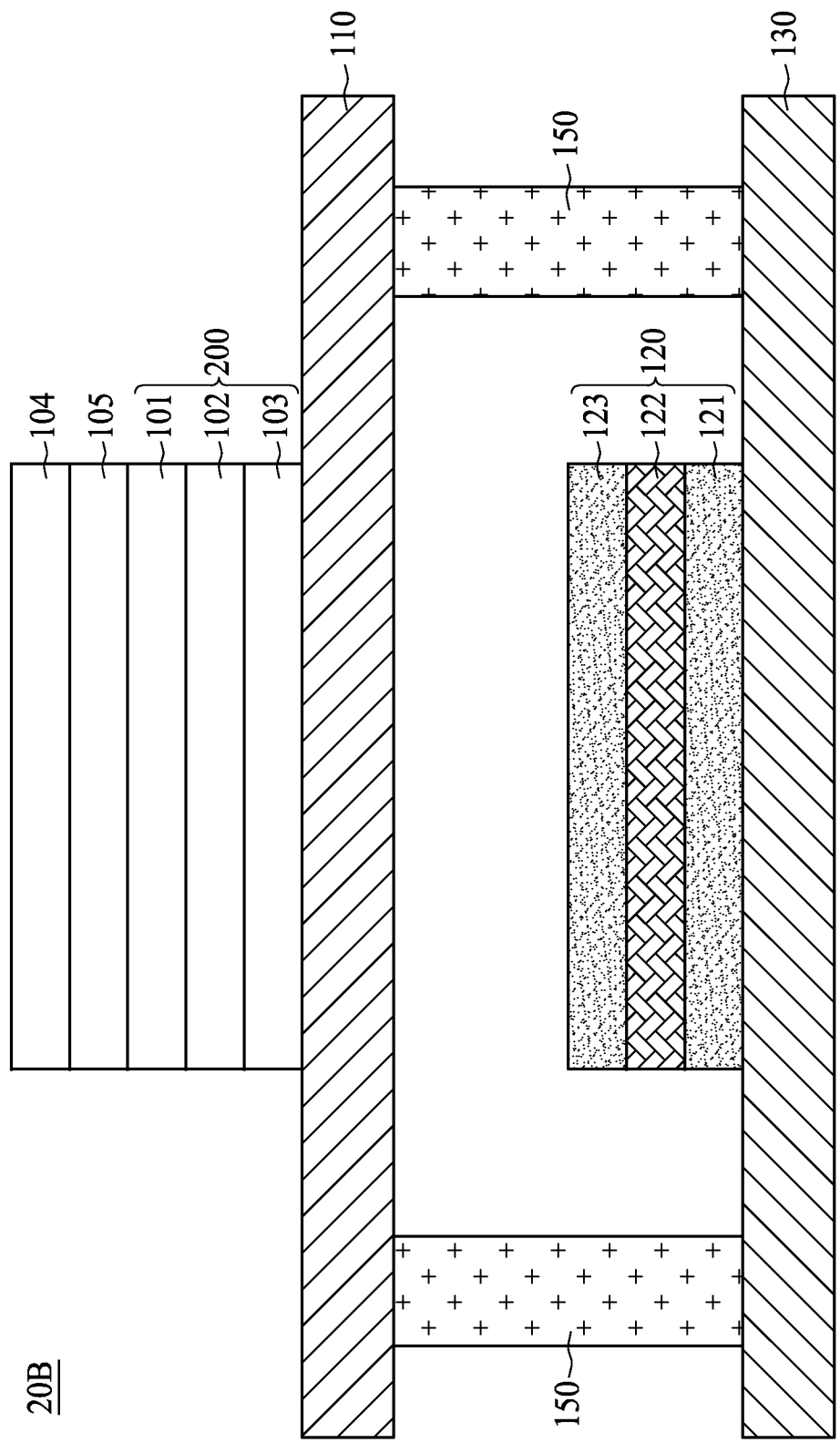
FIG. 3 is a schematic sectional view of a top-emitting OLED display having a transparent touch panel, a protective layer, and a polarizer in accordance with one embodiment of the present invention.

As shown in FIG. 2, a polarizer 105 is stacked on top of the protective layer 104. To better protect the capacitive touch device 200 and the underlying OLED 120 from UV light, the polarizer 105 can be combined with the protective layer 104 in order to raise the mechanical reliability and the resistance to damaging illumination. However, the polarizer 105 can either be placed on top of the protective layer 104 as shown in FIG. 2, or be placed at the bottom of the protective layer 104 as shown in FIG. 3. In one embodiment of the present invention, the material of the polarizer can be poly vinyl alcohol (PVA), triacetyl cellulose (TAC), cellulose diacetate (DAC), polyethylene terephthalate (PET), cyclo olefin polymer (COP), cyclic olefin copolymers (COC), polycarbonate (PC), or the combination thereof. The thickness of the polarizer in the embodiment is 0.22 µm. However, any thickness ranging from 0.19 µm to 0.025 µm is considered equitable in serving as a polarizer given the above-mentioned material is used.

Figure 4:
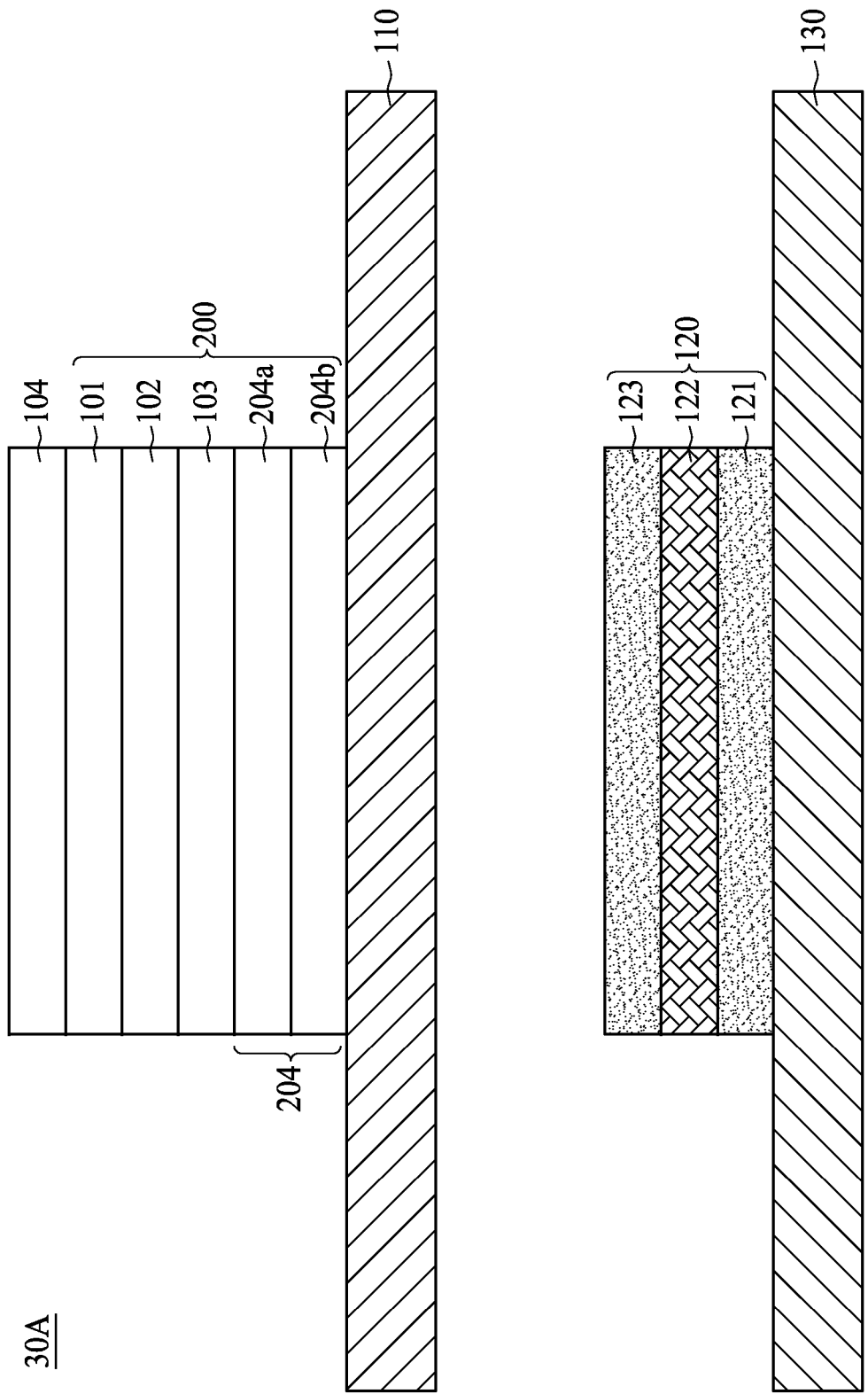
FIG. 4 is a schematic sectional view of a top-emitting OLED display having a transparent touch panel, a protective layer, and an electromagnetic shielding layer in accordance with one embodiment of the present invention.

FIG. 4 is a schematic sectional view of a top-emitting OLED display having a transparent touch panel 30A, a protective layer 104, and an electromagnetic shielding layer 204 in accordance with one embodiment of the present invention. The electromagnetic shielding layer 204 is disposed between the upper cover plate 110 and the capacitor structure (101, 102, 103). The shielding layer 204 is able to effectively reduce the electromagnetic interference between the OLED display 120 and the capacitive touch device 200. As shown in FIG. 4, the electromagnetic shielding layer 204 includes two at least two sub-layers, namely a polymer insulating layer 204a and a third transparent conductive layer 204b. The polymer insulating layer 204a can be chosen from materials such as epoxy, poly-imide, poly(methyl methacrylate), or the combination thereof; whereas the third transparent conductive layer 204b can be chosen from conductive oxides, for example, indium tin oxide (ITO), indium zinc oxide (IZO), aluminum zinc oxide (AZO), and the combination thereof.

Figure 5:
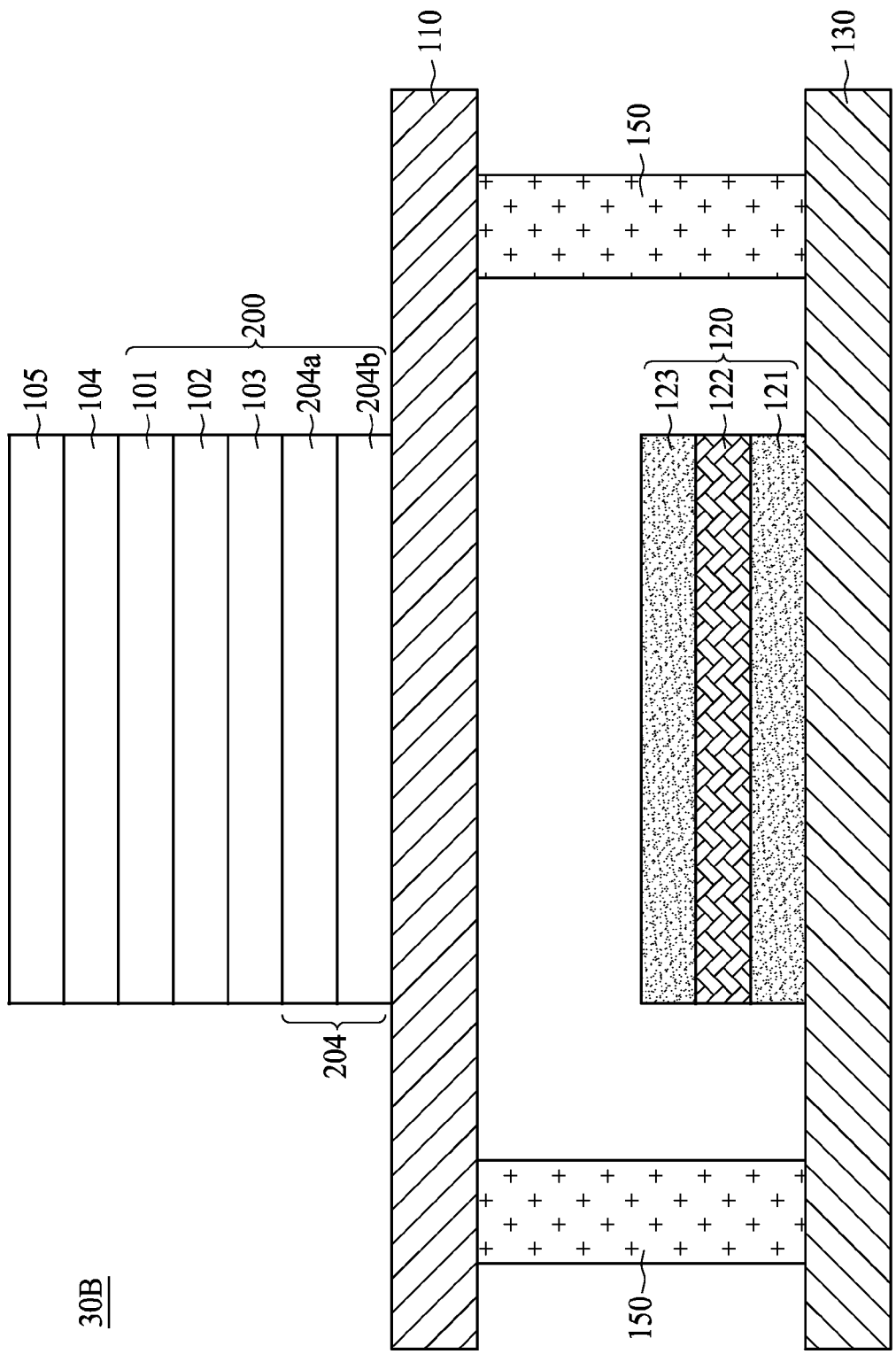
FIG. 5 is a schematic sectional view of a top-emitting OLED display having a transparent touch panel, a protective layer, a polarizer, and an electromagnetic shielding layer in accordance with one embodiment of the present invention.
Figure 6:
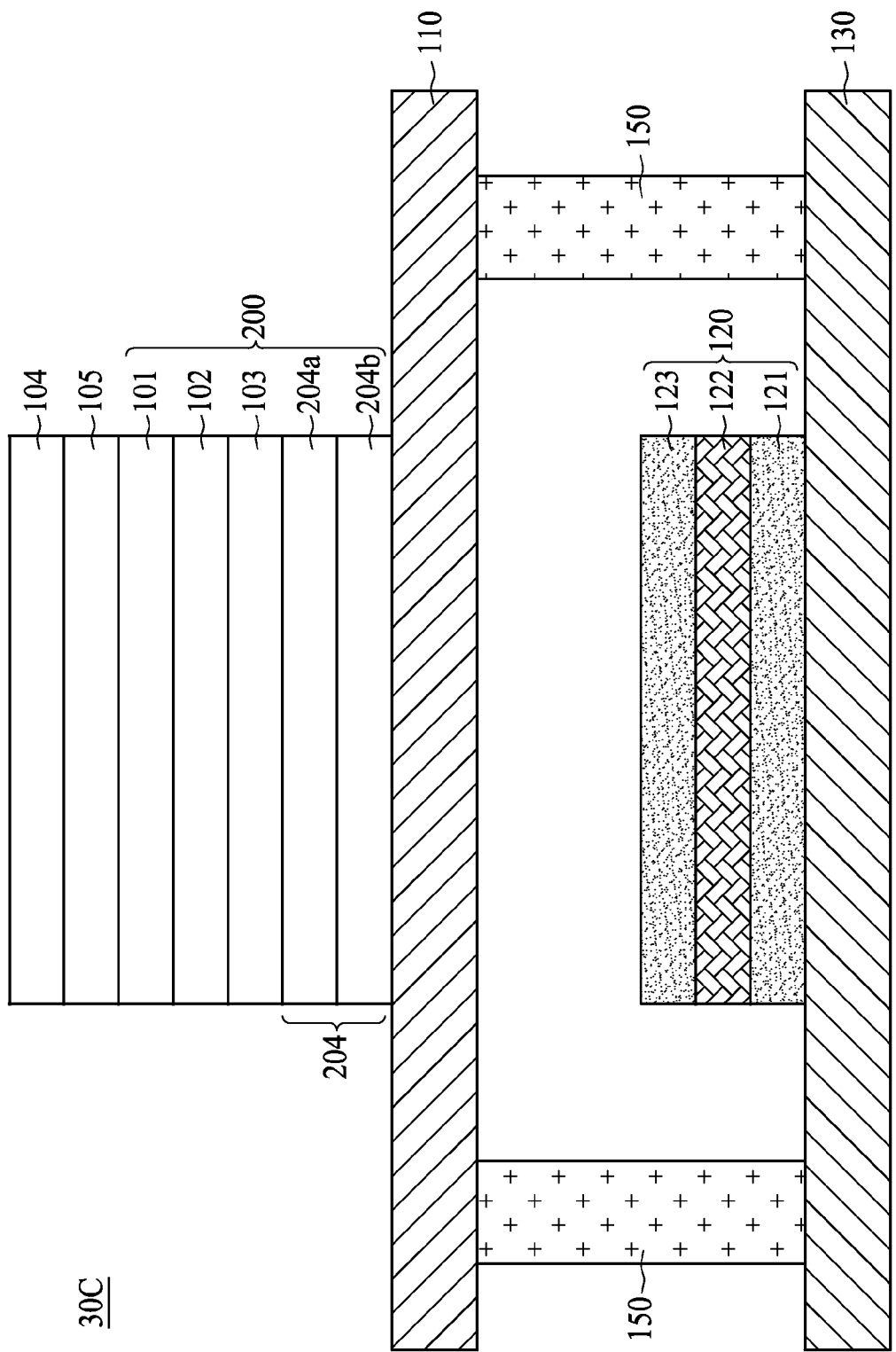
FIG. 6 is a schematic sectional view of a top-emitting OLED display having a transparent touch panel, a protective layer, a polarizer, and an electromagnetic shielding layer in accordance with one embodiment of the present invention.

Note the absence of the sealant layer 150 in the embodiment shown in FIG. 4, an alternative structure is illustrated in FIG. 5 as a top-emitting OLED display having a transparent touch panel 30B, a protective layer 104, a polarizer 105, and an electromagnetic shielding layer 204 in accordance with one embodiment of the present invention. The OLED display structure in FIG. 5 possesses a sealant layer 150 surrounding the OLED device 120. The polarizer 105 can either be placed on top of the protective layer 104 as shown in FIG. 5, or be placed at the bottom of the protective layer 104 as shown in the top-emitting OLED display having a transparent touch panel 30C in FIG. 6.

Figure 7:
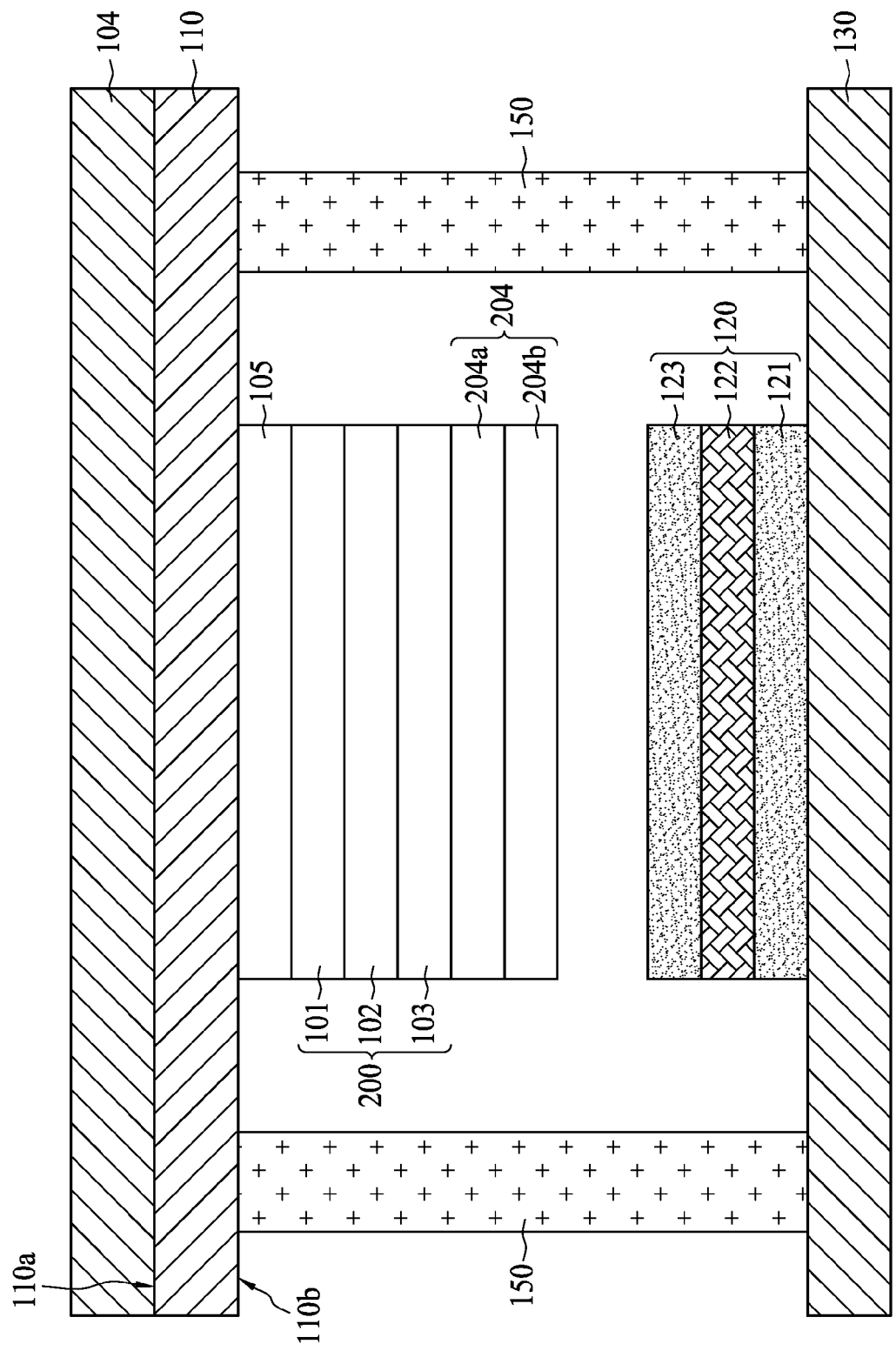
FIG. 7 is a schematic sectional view of a top-emitting OLED display having a transparent touch panel, a protective layer, a polarizer, and an electromagnetic shielding layer in accordance with the one embodiment of the present invention.

In another embodiment of the present invention as shown in FIG. 7, the capacitive touch device 200 of the top-emitting OLED display having a transparent touch panel 30D is attached to the bottom surface 110b of the upper cover plate 110, and the electromagnetic shielding layer 204 is disposed between the OLED device 120 and the capacitor structure (101, 102, 103). In this embodiment, a polarizer 105 is positioned between the upper cover plate 110 and the capacitor structure. A protective layer 104 can be optionally disposed on the upper surface 110a of the upper cover plate 110.

In one embodiment of the present invention, the OLED device 120 includes an anode layer 121, a light emitting layer 122, and a cathode layer 123 sequentially stacked on the substrate 130. The material of the substrate 130 and the upper cover plate 110 can be identical or different. The transparent materials can be glass, polycarbonate (PC), polyvinyl chloride (PVC), or the combination thereof.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A top-emitting organic light emitting diode (OLED) display having a transparent touch panel, comprising:
    a substrate;
    an upper cover plate;
    an OLED device stacked on the substrate; and
    a capacitive touch device stacked on a surface of the upper cover plate, and wherein the capacitive touch device comprises:
        a first transparent conductive layer;
        an isolating layer; and
        a second transparent conductive layer; and
    a protective layer;
    wherein the first transparent conductive layer, the isolating layer, and the second transparent conductive layer form a capacitor, and the protective layer is disposed on the capacitor, and
    wherein the capacitive touch device further comprises a polarizer disposed over the capacitor.

2. The top-emitting OLED display of claim 1, wherein the capacitive touch device stacked on the upper surface of the upper cover plate.

3. The top-emitting OLED display of claim 1, further comprising a sealant layer surrounding the OLED device, wherein the OLED device is sealed by the substrate, the sealant layer, and the upper cover plate; and the upper cover plate is attached to the substrate by the sealant layer.

4. The top-emitting OLED display of claim 1, wherein the protective layer comprises inorganic materials selected from the group consisting of silicon oxide, silicon nitride, titanium oxide, and the combination thereof.

5. The top-emitting OLED display of claim 4, wherein the thickness of the protective layer is between a range of from 0.01 μm to 0.1 μm.

6. The top-emitting OLED display of claim 1, wherein the protective layer comprises organic materials selected from the group consisting of polyimide, poly(methyl methacrylate), and the combination thereof.

7. The top-emitting OLED display of claim 6, wherein the thickness of the protective layer is smaller than 2 μm.

8. The top-emitting OLED display of claim 1, wherein the protective layer is positioned on top of the polarizer.

9. The top-emitting OLED display of claim 1, wherein the polarizer is positioned on top of the protective layer.

10. The top-emitting OLED display of claim 1, wherein the material of the polarizer is selected from the group consisting of poly vinyl alcohol (PVA), triacetyl cellulose (TAC), cellulose diacetate (DAC), polyethylene terephthalate (PET), cyclo olefin polymer (COP), cyclic olefin copolymers (COC), polycarbonate (PC), and the combination thereof.

11. The top-emitting OLED display of claim 10, wherein the thickness of the polarizer is between a range of from 0.19 μm to 0.25 μm.

12. The top-emitting OLED display of claim 2, wherein the capacitive touch device further comprises an electromagnetic shielding layer disposed between the upper cover plate and the capacitor, and the shielding layer effectively reduces the electromagnetic interference between the OLED display and the capacitive touch device.

13. The top-emitting OLED display of claim 12, wherein the electromagnetic shielding layer comprises a polymer insulating layer and a third transparent conductive layer.

14. The top-emitting OLED display of claim 13, wherein the material of the polymer insulating layer is selected from the group consisting of epoxy, poly-imide, poly(methyl methacrylate), and the combination thereof.

15. The top-emitting OLED display of claim 13, wherein the third transparent conductive layer is selected from the group consisting of indium tin oxide (ITO), indium zinc oxide (IZO), aluminum zinc oxide (AZO), and the combination thereof.

16. The top-emitting OLED display of claim 1, wherein the first transparent conductive layer and the second transparent conductive layer are selected from the group consisting of indium tin oxide (ITO), indium zinc oxide (IZO), aluminum zinc oxide (AZO), and the combination thereof.

17. The top-emitting OLED display of claim 1, wherein the OLED device comprises an anode layer, a light emitting layer, and a cathode layer.

18. The top-emitting OLED display of claim 1, wherein the isolating layer is selected from the group consisting of epoxy, poly-imide and methyl methacrylate.

19. The top-emitting OLED display of claim 1, wherein the substrate and the upper cover plate are selected from the group consisting of glass, polycarbonate, polyvinyl chloride, and the combination thereof.

20. A top-emitting organic light emitting diode (OLED) display having a transparent touch panel, comprising:
   a substrate;
   an upper cover plate;
   an OLED device stacked on the substrate; and
   a capacitive touch device stacked on a surface of the upper cover plate;
   wherein the OLED device is enclosed by the substrate and the upper cover plate, and
   wherein the capacitive touch device further comprises a capacitor and a polarizer disposed over the capacitor.

21. The top-emitting OLED display having a transparent touch panel of claim 20, further comprising a sealant layer for combining the substrate and the upper cover plate and enclosing the OLED device therebetween.

22. The top-emitting OLED display having a transparent touch panel of claim 20, wherein the capacitive touch device comprises a first transparent conductive layer, an isolating layer and a second transparent conductive layer sequentially formed on an upper surface of the upper cover plate, and the first transparent conductive layer and the second transparent conductive layer form the capacitor.

23. The top-emitting OLED display having a transparent touch panel of claim 22, wherein the capacitive touch device further comprises an electromagnetic shielding layer interposed between the first transparent conductive layer and the upper cover plate.

24. The top-emitting OLED display having a transparent touch panel of claim 20, wherein the capacitive touch device comprises a first transparent conductive layer, an isolating layer and a second transparent conductive layer sequentially formed on a lower surface of the upper cover plate, and the first transparent conductive layer and the second transparent conductive layer form a capacitor.

25. The top-emitting OLED display having a transparent touch panel of claim 24, wherein the capacitive touch device further comprises an electromagnetic shielding layer stacked on the second transparent conductive layer.

26. The top-emitting OLED display having a transparent touch panel of claim 25, wherein the electromagnetic shielding layer comprises a polymer insulating layer and a transparent conductive layer.

27. The top-emitting OLED display having a transparent touch panel of claim 26, wherein the material of the polymer insulating layer is selected from the group consisting substantially of epoxy, poly-imide and methyl methacrylate.

28. The top-emitting OLED display having a transparent touch panel of claim 26, wherein the transparent conductive layer is selected from the group consisting substantially of indium tin oxide (ITO), indium zinc oxide (IZO) and aluminum zinc oxide (AZO).

29. The top-emitting OLED display having a transparent touch panel of claim 20, wherein the OLED device comprises an anode layer, a light emitting layer and a cathode layer sequentially formed on the substrate.

30. The top-emitting OLED display having a transparent touch panel of claim 22, wherein the first transparent conductive layer and the second transparent conductive layer are selected from the group consisting substantially of ITO, IZO and AZO.

31. The top-emitting OLED display having a transparent touch panel of claim 22, wherein the isolating layer is selected from the group consisting substantially of epoxy, poly-imide and methyl methacrylate.

32. The top-emitting OLED display having a transparent touch panel of claim 20, wherein the substrate and the upper cover plate are selected from the group consisting substantially of glass, polycarbonate and polyvinyl chloride.

* * * * *